United States Patent
Briere

(10) Patent No.: US 8,159,003 B2
(45) Date of Patent: Apr. 17, 2012

(54) III-NITRIDE WAFER AND DEVICES FORMED IN A III-NITRIDE WAFER

(75) Inventor: Michael A. Briere, Woonsocket, RI (US)

(73) Assignee: International Rectifier Corporation, El Segundo, CA (US)

( * ) Notice: Subject to any disclaimer, the term of this patent is extended or adjusted under 35 U.S.C. 154(b) by 446 days.

(21) Appl. No.: 12/324,119

(22) Filed: Nov. 26, 2008

(65) Prior Publication Data

US 2009/0194793 A1    Aug. 6, 2009

Related U.S. Application Data

(60) Provisional application No. 60/990,142, filed on Nov. 26, 2007.

(51) Int. Cl.
*H01L 31/0328* (2006.01)

(52) U.S. Cl. .. 257/194; 257/475; 257/523; 257/E29.246
(58) Field of Classification Search .................. 257/194, 257/47, 475, 523
See application file for complete search history.

(56) References Cited

U.S. PATENT DOCUMENTS

| | | | |
|---|---|---|---|
| 2004/0209402 A1* | 10/2004 | Chai et al. | 438/122 |
| 2008/0023706 A1* | 1/2008 | Saito et al. | 257/76 |
| 2009/0194793 A1 | 8/2009 | Briere | |

FOREIGN PATENT DOCUMENTS

SG    60/858076    * 11/2006

* cited by examiner

*Primary Examiner* — Wai Sing Louie
(74) *Attorney, Agent, or Firm* — Farjami & Farjami LLP

(57) ABSTRACT

A III-nitride device having a support substrate that may include a first silicon body, a second silicon body, an insulation body interposed between the first and second silicon bodies, and a III-nitride body formed over the second silicon body.

17 Claims, 4 Drawing Sheets

III-NITRIDE WAFER AND DEVICES FORMED IN A III-NITRIDE WAFER

RELATED APPLICATION

This application claims benefit of U.S. Provisional Application No. 60/990,142, filed Nov. 26, 2007, entitled III-Nitride Wafer and Devices Formed in a III-Nitride Wafer, to which a claim of priority is hereby made and the disclosure of which is incorporated by reference. This application is also related to U.S. application Ser. No. 12/174,329, filed Jul. 16, 2008, entitled III-Nitride Device.

DEFINITION

III-nitride refers to a semiconductor alloy from the InAlGaN system that includes nitrogen and at least one group III element such as, but not limited to, GaN, AlGaN, InN, AlN, InGaN, InAlGaN and the like.

BACKGROUND AND SUMMARY OF THE INVENTION

The present invention relates to a wafer for the fabrication of III-nitride power devices and III-nitride power devices formed using a wafer according to the present invention.

III-nitride, because of its high bandgap, is suitable for high voltage power applications. According to a known design, a III-nitride power device may be fabricated by forming a III-nitride heterojunction over a silicon substrate. However, due to leakage through the substrate, the breakdown capability of such devices is diminished.

An objective of the present invention is to provide a wafer for the fabrication of III-nitride devices, and particularly, high voltage (above 600 Volts) III-nitride power semiconductor devices.

A semiconductor wafer according to the present invention includes a support substrate having a first silicon body, a second silicon body and an insulation body interposed between the first silicon body and the second silicon body, and a III-nitride body formed over the second silicon body.

The III-nitride body preferably includes a III-nitride heterojunction comprised of a first III-nitride layer of one band gap and a second III-nitride layer of another band gap formed over the first III-nitride layer. The III-nitride body may further include a III-nitride buffer layer interposed between the III-nitride heterojunction and the second silicon body.

According to one aspect of the present invention, the second silicon body may be comprised of <111> silicon. In one embodiment, the first silicon body may be <111> silicon, and in another embodiment the first silicon body may be <100> silicon. In both embodiments, the insulation body may be comprised of silicon dioxide.

According to another aspect of the present invention, the III-nitride body may be used for the fabrication of a power semiconductor device.

Other features and advantages of the present invention will become apparent from the following description of the invention which refers to the accompanying drawings.

DETAILED DESCRIPTION OF THE FIGURES

Figure 1:
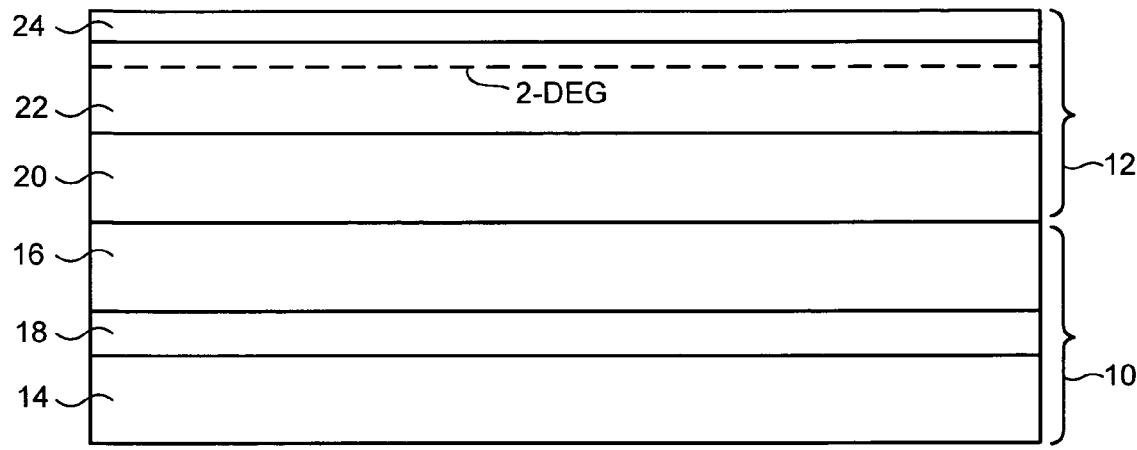
FIG. 1 illustrates a cross-sectional view of a semiconductor wafer according to the present invention.

Referring to FIG. 1, a semiconductor wafer according to an embodiment of the present invention includes a support substrate 10 and a III-nitride semiconductor body 12 formed over support substrate 10.

According to an aspect of the present invention, support substrate 10 includes a first silicon body 14, a second silicon body 16 and an insulation body 18 interposed between first silicon body 14 and second silicon body 18. In one embodiment, first silicon body 14 may be a <111> single crystal silicon, second silicon body may be <111> single crystal silicon, and insulation body 18 may be silicon dioxide. In another embodiment, first silicon body 14 may be <100> silicon, second silicon body 16 may be <111> silicon, and insulation body 18 may be silicon dioxide.

In both embodiments, an SOI (silicon on insulator) substrate is suitable. Such substrates include two silicon substrates bonded to one another by a silicon dioxide layer. The first embodiment can also be realized by a SiMox process whereby implantation of oxygen into a <111> silicon substrate followed by an annealing step forms an insulation body 18 made of silicon dioxide between a first <111> silicon body 14 and a second <111> silicon body. Note that second silicon body 16 may optionally include an epitaxially grown layer thereon.

III-nitride semiconductor body 12 includes, in one preferred embodiment, a III-nitride buffer layer 20 (e.g. AlN), over second silicon body 16, and a III-nitride heterojunction formed over III-nitride buffer layer 20, that includes a first III-nitride layer 22 having one band gap (e.g. GaN) and a second III-nitride layer 24 having another band gap (e.g. AlGaN, InAlGaN, InGaN, etc.) formed over first layer 22. In a wafer according to the present invention the composition and/or the thickness of first and second III-nitride layers 22 and 24 are selected to result in the formation of a carrier rich region referred to as a two-dimensional electron gas (2-DEG) near the heterojunction thereof.

Figure 2:
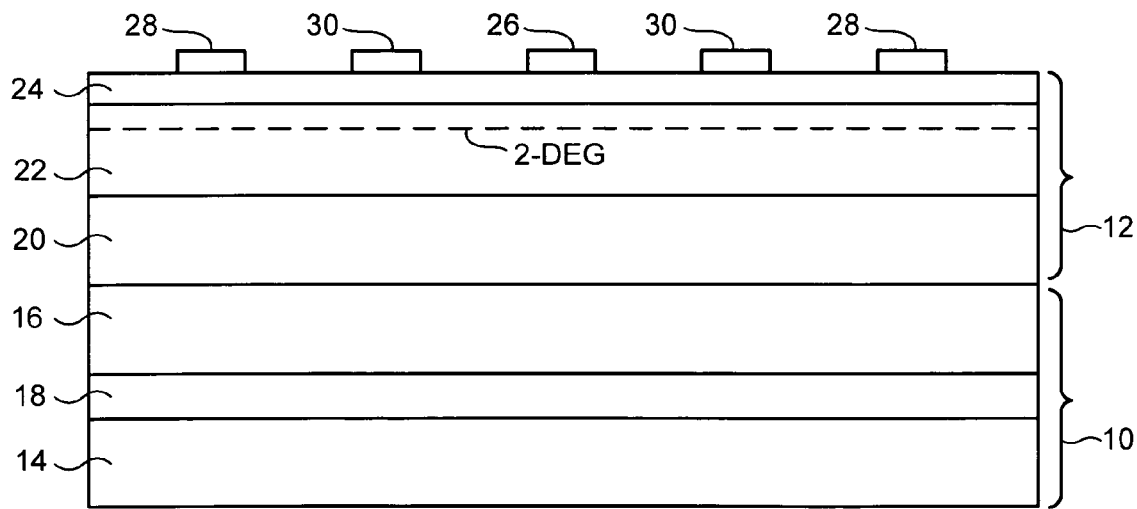
FIG. 2 illustrates a cross-sectional view of a III-nitride semiconductor device according to the present invention.

Referring to FIG. 2, according to one aspect of the present invention, the III-nitride heterojunction can be used as the current carrying region of a III-nitride power semiconductor device (e.g. a high electron mobility transistor).

Such a device may include first and second power electrodes 26, 28 (e.g. source and drain electrodes) coupled to the 2-DEG through second III-nitride layer 24 and gate arrangements 30 each disposed between a respective first power electrode 26 and second power electrode 28. A gate arrangement may include an insulated gate electrode or a gate electrode that makes Schottky contact to second III-nitride layer 24.

Figure 3:
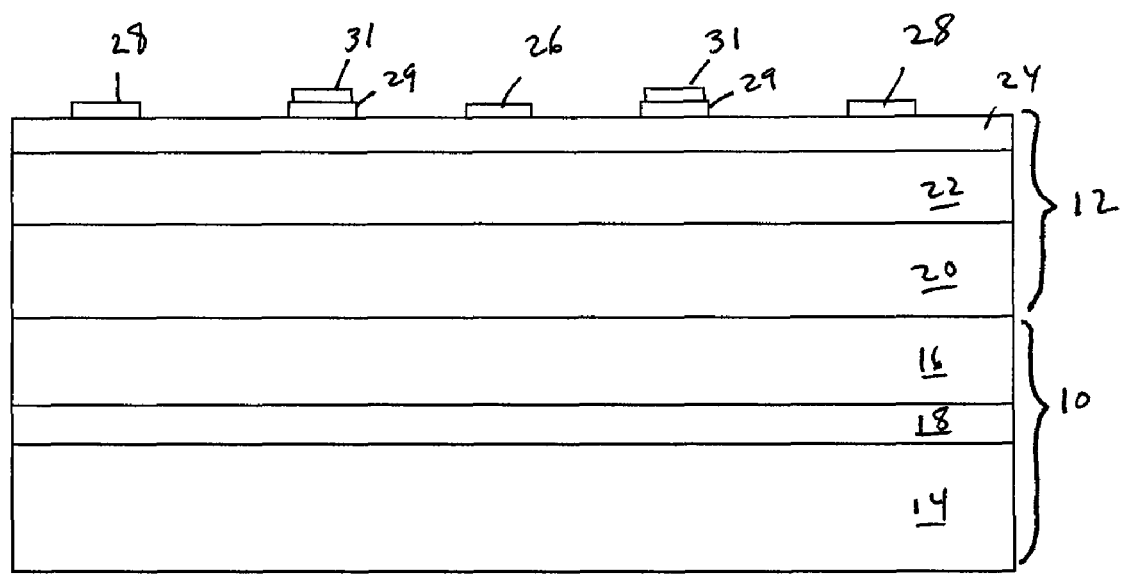
FIG. 3 illustrates a cross-sectional view of a III-nitride semiconductor device according to the present invention that includes an insulated gate arrangement.

Referring, for example, to FIG. 3, a III-nitride power semiconductor device having an insulated gate arrangement may include a gate dielectric 29 (e.g. silicon dioxide or silicon nitride) disposed between a gate electrode 31 and second III-nitride layer 24.

Figure 4:
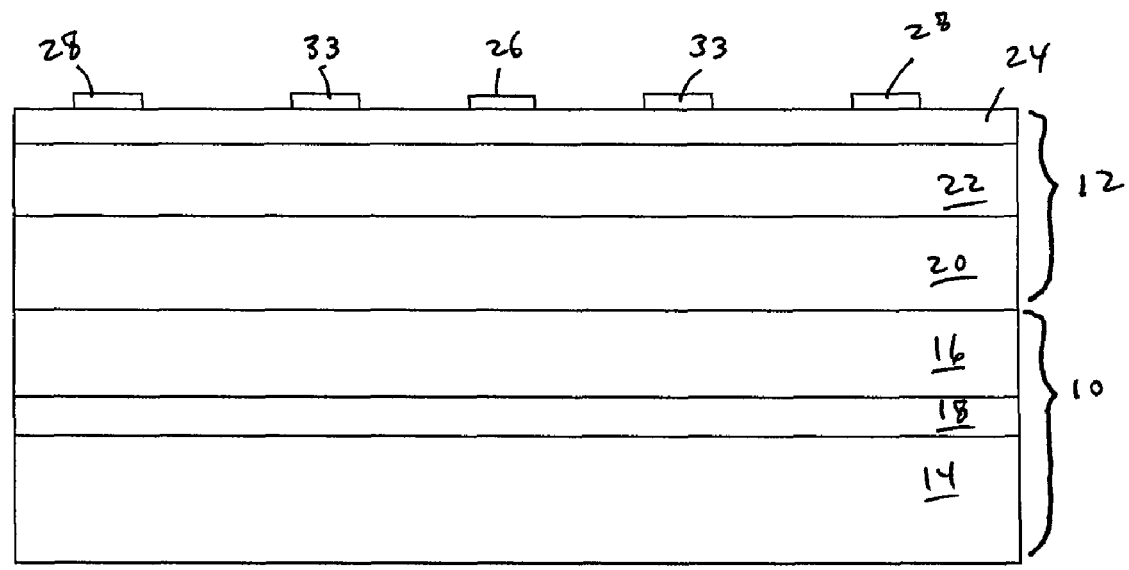
FIG. 4 illustrates a cross-sectional view of a III-nitride semiconductor device according to the present invention that includes a schottky gate arrangement.

Referring, for example, to FIG. 4, a III-nitride power semiconductor device having a schottky gate electrode may include a gate electrode 33 that makes schottky contact with second III-nitride layer 24.

Also, a III-nitride power semiconductor device may be an enhancement mode device (normally off when no gate voltage is applied to the gate electrode thereof) or a depletion mode device (normally on when no gate voltage is applied to the gate electrode thereof).

Figure 5:
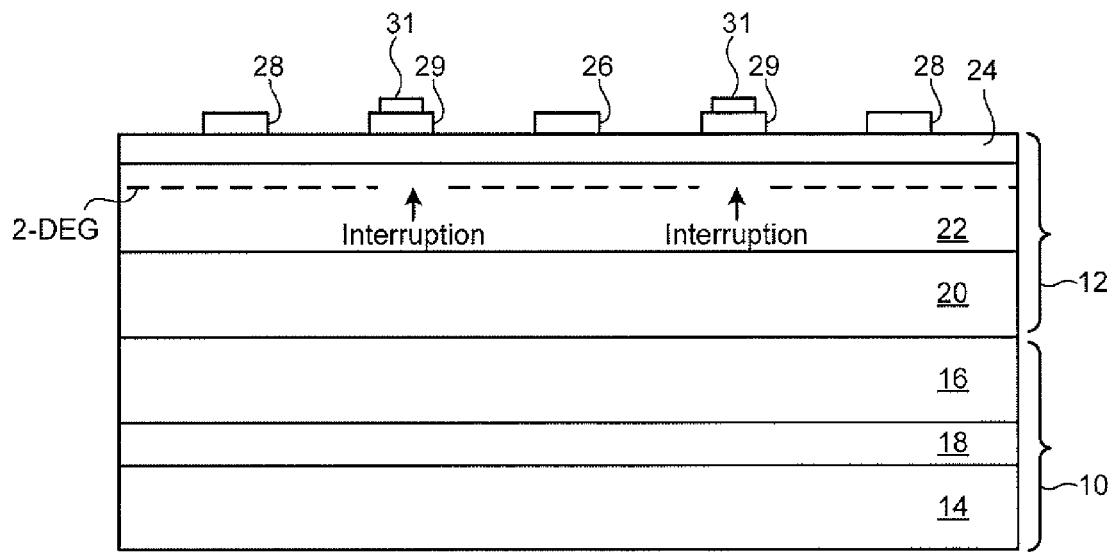
FIG. 5 illustrates a cross-sectional view of an enhancement mode III-nitride semiconductor device according to the present invention that includes an insulated gate arrangement.
Figure 6:
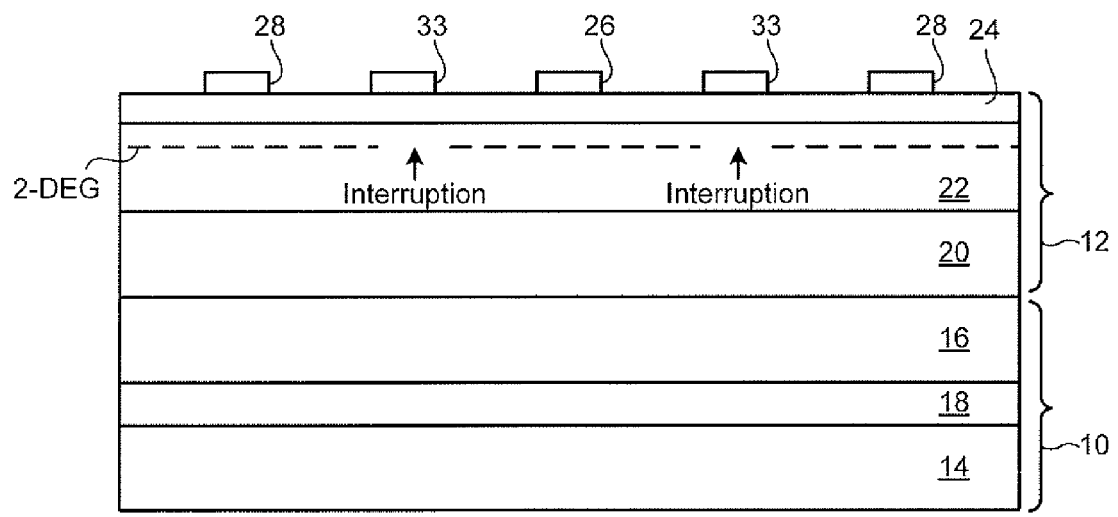
FIG. 6 illustrates a cross-sectional view of an enhancement mode III-nitride semiconductor device according to the present invention that includes a schottky gate arrangement.

Referring to FIGS. 5 and 6, an enhancement mode device having an insulated gate arrangement (FIG. 5) or a schottky gate (FIG. 6) may have an interrupted 2-DEG directly under the gate arrangement thereof which can be restored to allow for current conduction upon application of an appropriate voltage (threshold voltage). Examples of various enhancement mode III-nitride power semiconductor device can be found in US 2006/0060871, which is assigned to the assignee of the present application.

Figure 7:
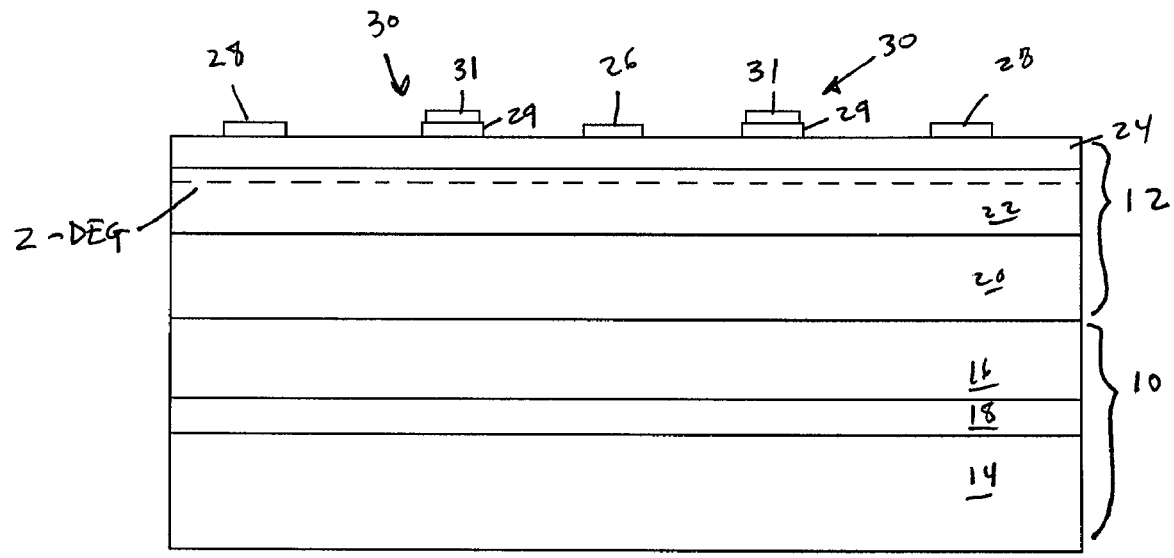
FIG. 7 illustrates a cross-sectional view of a depletion mode III-nitride semiconductor device according to the present invention that includes an insulated gate arrangement.
Figure 8:
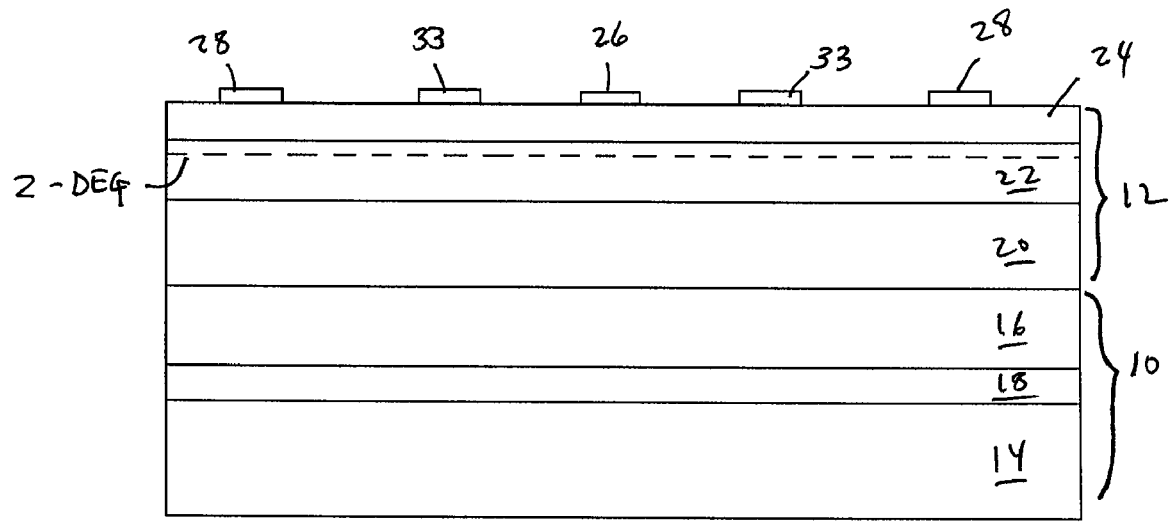
FIG. 8 illustrates a cross-sectional view of a depletion mode III-nitride semiconductor device according to the present invention that includes a schottky gate arrangement.

Referring to FIGS. 7 and 8, a depletion mode device having an insulated gate arrangement (FIG. 7) or a schottky gate (FIG. 8) may have 2-DEG directly under the gate arrangement thereof which can be interrupted to prevent current conduction upon application of an appropriate voltage (threshold voltage). An example of a depletion mode III-nitride power semiconductor device is disclosed in U.S. Pat. No. 5,192,987.

A wafer according to the present invention can be used to devise power devices for high voltage applications because of the presence of insulation body 18, which reduces leakage current into the substrate and improves the breakdown voltage of the device. For example, when insulation body 18 is silicon dioxide its thickness can be 0.1 to 2 microns. In one embodiment, for instance, silicon body 18 may be about 0.5 microns thick for a 700-1000 volt III-nitride power device.

Note further that silicon bodies 14 and 16 may be doped with N-type dopants or P-type dopant.

According to one embodiment of the present invention silicon bodies 14, 16 may be N++ doped or P++ doped. N++ doped or P++ doped first silicon body 14 can improve the breakdown capability of the device by taking advantage of the resurf effect.

In one embodiment, an SOI substrate may be used in which second silicon body 16 may be doped with P type dopants. For example, second silicon body may be P++ doped, and then a III-nitride semiconductor device may be formed thereon. In an alternative embodiment, a P-type silicon body may epitaxially grown over a second silicon body 16, and then a III-nitride semiconductor device may be formed on the epitaxially grown silicon body.

In an alternative embodiment, one side of a first silicon substrate may be implanted with P-type dopants, followed by hydrogen implantation close to the final depth of the implanted region. Thereafter, the top surface of the P-type region is oxidized, and a second silicon substrate (a handle substrate) is bonded to the oxidized surface. Next, the P-type region is cleaved along the hydrogen implant region, and a III-nitride power semiconductor device is fabricated over the P-type region, which constitutes second silicon body 16.

Note that second silicon body 16 may be N-type doped instead of being P-type doped if the III-nitride body thereon is P-type doped.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A semiconductor device, comprising:
   a support substrate that includes a first silicon body, a second silicon body and an insulation body interposed between said first silicon body and said second silicon body; and
   a III-nitride body formed over said second silicon body;
   wherein said first silicon body is doped with impurities to utilize a RESURF effect.

2. The device of claim 1, wherein said III-nitride body includes a III-nitride heterojunction comprised of a first III-nitride layer of one band gap and a second III-nitride layer of another band gap formed over said first III-nitride layer.

3. The device of claim 2, wherein said III-nitride body includes a buffer layer interposed between said III-nitride heterojunction and said second silicon body.

4. The device of claim 1, wherein said second silicon body is comprised of (111) silicon.

5. The device of claim 4, wherein said first silicon body is comprised of (111) silicon.

6. The device of claim 4, wherein said first silicon body is comprised of (100) silicon.

7. The device of claim 1, wherein said insulation body is comprised of silicon dioxide.

8. The device of claim 1, wherein said insulation body is between 0.1 to 2 microns thick.

9. The device of claim 1, wherein said insulation body is about 0.5 microns thick.

10. The device of claim 1, wherein said insulation body binds said first silicon body to said second silicon body.

11. The device of claim 1, wherein said first silicon body is N++ doped.

12. The device of claim 1, wherein said first silicon body is P++ doped.

13. The device of claim 1, wherein said second silicon body includes an epitaxially formed portion.

14. The device of claim 1, further comprising power electrodes formed over said III-nitride body.

15. The device of claim 14, further comprising a gate arrangement disposed over said III-nitride body between respective power electrodes.

16. The device of claim 15, wherein said gate arrangement includes a gate dielectric and a gate electrode.

17. The device of claim 15, wherein said III-nitride body includes a III-nitride heterojunction having a two dimensional electron gas that includes interrupted regions directly under said gate arrangement.

* * * * *